United States Patent
Park et al.

(10) Patent No.: US 6,346,444 B1
(45) Date of Patent: Feb. 12, 2002

(54) POWER SEMICONDUCTOR DEVICE USING SEMI-INSULATING POLYCRYSTALLINE SILICON AND FABRICATION METHOD THEREOF

(75) Inventors: Chan-ho Park, Incheon; Jin-kyeong Kim; Jae-hong Park, both of Kyungki-do, all of (KR)

(73) Assignee: Fairchild Korea Semiconductor, Ltd., Buchon (KR)

( * ) Notice: Subject to any disclaimer, the term of this patent is extended or adjusted under 35 U.S.C. 154(b) by 0 days.

(21) Appl. No.: 09/653,550

(22) Filed: Aug. 31, 2000

Related U.S. Application Data

(62) Division of application No. 09/247,507, filed on Feb. 10, 1999.

(30) Foreign Application Priority Data

Feb. 24, 1998 (KR) .............................................. 98-5808

(51) Int. Cl.[7] .............................................. H01L 21/336
(52) U.S. Cl. ..................... 438/268; 438/282; 438/283
(58) Field of Search ................................. 438/268, 282, 438/283, 272, 273, 699

(56) References Cited

U.S. PATENT DOCUMENTS 5,060,047 A    10/1991   Jaume et al.
6,040,219 A  * 3/2000    Park et al.

FOREIGN PATENT DOCUMENTS

JP    59-105362    6/1984

OTHER PUBLICATIONS

IEEE Transactions on Electron Devices, Aug. 1976.
Matsushita et al.: Highly Reliable High–Voltage Transistors.
A. Mimura et al; High–Voltage Planar Structure Using S102–SIPOS–SIO2 Film; IEEE Electron Device Letters, vol. EDL–6, No. 4, Apr. 1985.
D. Jaume et al.; High–Voltage Planar Devices Using Field Plate and Semi–Resistive Layers; IEEE Transactions on Electron Devices, vol. 38, No. 7, Jul. 1991.

* cited by examiner

*Primary Examiner*—Kevin M. Picardat
*Assistant Examiner*—D. M. Collins
(74) *Attorney, Agent, or Firm*—Volentine Francos, PLLC

(57) ABSTRACT

A power semiconductor device having an improved high breakdown voltage and improved productivity, and a fabrication method thereof are provided. The power semiconductor includes a collector region of a first conductivity type formed in a semiconductor substrate, a base region of second conductivity type formed in the collector region, and an emitter region of the first conductivity type formed in the base region. A channel stop region is formed being spaced a predetermined distance from the base region. An insulative film, a semi-insulating polycrystalline silicon (SIPOS) film, and a nitride film patterned respectively to expose the emitter region, the base region, and the channel stop region are sequentially deposited on the semiconductor substrate. A base electrode, an emitter electrode, and an equipotential electrode connected respectively to the base region, the emitter region, and the channel stop region are formed.

11 Claims, 8 Drawing Sheets

US 6,346,444 B1

POWER SEMICONDUCTOR DEVICE USING SEMI-INSULATING POLYCRYSTALLINE SILICON AND FABRICATION METHOD THEREOF

CROSS REFERENCE TO RELATED APPLICATIONS

This is a divisional application of application Ser. No. 09/247,507, filed Feb. 10, 1999, which is hereby incorporated by reference in its entirety for all purposes.

BACKGROUND OF THE INVENTION

1. Field of the Invention

The present invention relates to a power semiconductor device and a fabrication method thereof, and more particularly, to a power semiconductor device which has a high breakdown voltage structure using semi-insulating polycrystalline silicon, and a fabrication method thereof.

2. Description of the Related Art

With a recent trend toward large-sized and large capacity application apparatuses, a power semiconductor device having a high breakdown voltage, a high current capacity, and highspeed switching characteristics has become necessary.

A power semiconductor device requires a low saturation voltage, particularly, to reduce power loss in a conductive state while flowing a significant amount of current. Also, the power semiconductor device fundamentally requires high breakdown voltage characteristics, such as a property that the power semiconductor device can sustain a high reverse voltage applied to both ends of the power semiconductor device when or at the moment when a switch is turned off. The power semiconductor device requires various high breakdown voltages from tens to thousands of volts according to its application.

Meanwhile, the breakdown voltage of the semiconductor device is determined by a depletion region formed in a PN junction, since the voltage applied to the PN junction is mostly applied to the depletion region. It is known that the breakdown voltage is affected by the curvature of the depletion region. That is, in a planar junction, the electric field is concentrated more on an edge of a junction portion having a large curvature than on a flat portion thereof, due to an electric field crowding effect. Thus, an avalanche breakdown easily occurs at the edge, and the breakdown voltage of the entire depletion region is reduced.

Accordingly, several technologies have been proposed to prevent the concentration of the electric field on the edge of the junction portion. The first one is forming a field plate (FP) on a substrate of a field region adjacent to the edge of the planar junction. The second one is forming a field limiting ring (FLR), being an impurity layer having the same conductive type as the junction portion, in the substrate of the field region. The third one is combining the first and second technologies.

A method of forming a semi-insulating polycrystalline silicon (SIPOS) film on a substrate in which a planar junction is formed, which is introduced in an article published in the early 1970's, has been continuously developed together with these technologies. The technology of manufacturing a high breakdown voltage semiconductor device using the SIPOS film can further reduce the area of a chip by about 10 to 20% compared to other technologies, and can obtain a stable breakdown voltage.

FIG. 1 is a cross-section of a high breakdown voltage transistor formed using a conventional SIPOS film.

Referring to FIG. 1, a base region 4 having a second conductivity type is formed on a collector region 2 having a first conductivity type, and an emitter region 6 having the first conductivity type is formed in the base region 4. A field limiting ring 8 for preventing an electric field from being concentrated on the edge of a junction between the collector region 2 and the base region 4 is formed a predetermined distance apart from the edge of the base region 4. A first conductive channel stop region 10 for isolation is formed in a field region spaced a predetermined distance apart from the field limiting ring 8.

In addition to the field limiting ring 8, An SIPOS film 12 for preventing concentration of the electric field on the edge of the junction, and an oxide film 14 are sequentially deposited on the semiconductor substrate. A base electrode 16, an emitter electrode 18, and an equipotential electrode 20 are formed, and a collector electrode 22 is formed on the bottom surface of the collector region 2.

At the "Third International Symposium on Power Semiconductor Devices and ICs" (in 1991), T. Stockmeler et al. applied and developed such a structure into a power diode structure which uses a technique for extending a junction edge portion instead of a field limiting ring, and uses a nitride film instead of an oxide film.

However, in such a structure, a remarkably large amount of reverse leakage current flows since the SIPOS film 12 is deposited directly on the semiconductor substrate. Thus, problems occur when actually applying this structure.

FIG. 2 is a cross-section of another power semiconductor device using a conventional SIPOS film. The same reference numerals as those in FIG. 1 denote the same elements, so they will not be described again.

Referring to FIG. 2, an oxide film 24 grown by thermal oxidation is first formed on a semiconductor substrate, and two SIPOS films 26 and 28 are deposited on the resultant structure. The first SIPOS film 26 on the oxide film 24 has an oxygen concentration of about 12%, and the second SIPOS film 28 has an oxygen concentration of about 25 to 30%. Thus, the surface is protected, and simultaneously a greater field plate effect can be provided than when the oxide film or nitride film is used.

However, when the SIPOS film is deposited in-situ twice, it is difficult to accurately control the thickness of the film or the concentration of oxygen. Therefore, determination of whether desired first and second SIPOS films are actually deposited is not possible during the process, thus difficult process management is expected. Also, the SIPOS film has a large scattering with respect to the high breakdown voltage, since it does not perform well under humid conditions. Furthermore, in the oxide film 24 deposited below the SIPOS film, the oxide film on the emitter region is 5,000 to 10,000 Å thick, the oxide film on the base region is 10,000 to 20,000 Å thick, and the oxide film on the field region is 15,000 to 30,000 Å thick. Thus, when the oxide film is dry etched in an etch process for forming a contact after forming the SIPOS film, the costs are high, and productivity of dry etch equipment is degraded.

SUMMARY OF THE INVENTION

It is an objective of the present invention to provide a power semiconductor device having improved characteristics by overcoming the above problems.

It is another objective of the present invention to provide a method for fabricating such a power semiconductor device.

Accordingly, to achieve the first objective, there is provided a power semiconductor device. The power semiconductor includes a collector region of a first conductivity type formed in a semiconductor substrate, a base region of a second conductivity type formed in the collector region, and an emitter region of the first conductivity type formed in the base region. A channel stop region is formed being spaced a predetermined distance from the base region. An insulative film, a semi-insulating polycrystalline silicon (SIPOS) film, and a nitride film patterned respectively to expose the emitter region, the base region, and the channel stop region are sequentially deposited on the semiconductor substrate. A base electrode, an emitter electrode, and an equipotential electrode are formed, which are connected respectively to the base region, the emitter region, and the channel stop region.

It is preferable that the insulative film on the emitter region is 500 to 5,000 Å thick, the insulating film on the base region is 1,000 to 10,000 Å thick, and the insulating film on a field region between the base region and the channel stop region is about 3,500 to 20,000 Å thick.

The nitride film is deposited by low pressure chemical vapor deposition (LP-CVD). The nitride film is preferably 500 to 5,000 Å thick. The base electrode extends a predetermined distance toward a field region. It is preferable that the nitride film and the SIPOS film each have a perpendicular sidewall, and the insulative film is isotropically etched to have an inclined sidewall.

To achieve the first objective, there is also provided another power semiconductor device. The device includes a cathode region having a first conductivity type formed in a semiconductor substrate, and an anode region having a second conductivity type formed in the cathode region. A channel stop region is spaced a predetermined distance from the anode region, in the cathode region. An insulative film, a SIPOS film, and a nitride film are sequentially deposited on the semiconductor substrate, which are patterned to expose parts of the anode region and the channel stop region. An anode electrode and an equipotential electrode are formed, which are connected respectively to the anode region and the channel stop region.

The insulative film on the channel stop region is preferably 500 to 5,000 Å thick, the insulative film on the anode region is preferably 1000 to 10,000 Å thick, and the insulative film on a field region between the anode region and the channel stop region is about 3,500 to 20,000 Å thick.

The nitride film is deposited by LP-CVD to a thickness of about 500 to 5,000 Å.

To achieve the second objective, there is provided a method of fabricating a power semiconductor device. In this method, a collector region of a first conductivity type is formed in a semiconductor substrate. An insulative film for exposing a region of the semiconductor substrate in which a base region is to be formed, is formed on the semiconductor substrate in which the collector region is formed. A base region of a second conductivity type is formed in the collector region, and simultaneously an insulative film is formed on the entire surface of the resultant structure. A region of the semiconductor substrate in which an emitter region and a channel stop region are to be formed is exposed. An emitter region of the first conductivity type and a channel stop region are formed by implanting impurities into the semiconductor substrate, and simultaneously an insulative film is formed on the entire surface of the semiconductor substrate. After the insulative film is etched by a predetermined thickness, an SIPOS film and a nitride film are formed on the entire surface of the resultant structure. Parts of the base region, emitter region and channel stop region are exposed, and a base electrode, an emitter electrode, and an equipotential electrode connected respectively to the base region, the emitter region, and the channel stop region are then formed.

In the step of etching the insulative film to a predetermined thickness, it is preferable that the insulative film on the emitter region is 500 to 5,000 Å thick, the insulative film on the base region is 1,000 to 10,000 Å thick, and the insulative film on a field region between the base region and the channel stop region is about 3,500 to 20,000 Å thick.

Also, it is preferable that the SIPOS film and the nitride film are deposited by LP-CVD, and the nitride film is 500 to 5,000 Å thick.

In the step of exposing parts of the base region, emitter region, and channel stop region, the nitride film, the SIPOS film, and the insulative film are sequentially dry-etched.

To achieve the second objective, there is also provided another method of fabricating a power semiconductor device. In this method, a collector region of a first conductivity type is formed in a semiconductor substrate. An insulative film for exposing a region of the semiconductor substrate in which a base region is to be formed, is formed on the semiconductor substrate in which the collector region is formed. A base region of a second conductivity type is formed in the collector region, and simultaneously an insulative film is formed on the entire surface of the resultant structure. A region of the semiconductor substrate in which an emitter region and a channel stop region are to be formed is exposed. An emitter region of a first conductivity type and a channel stop region are formed by implanting impurities into the semiconductor substrate, and simultaneously an insulative film is formed on the entire surface of the semiconductor substrate. An SIPOS film and a nitride film are formed on the entire surface of the resultant structure, and the nitride film and the SIPOS film on the base region, emitter region, and the channel stop region are then etched. A mask which exposes the insulative film on the base region, the emitter region and the channel stop region, is formed on the resultant structure. After the insulative is patterned using the mask, a base electrode, an emitter electrode, and an equipotential electrode connected respectively to the base region, the emitter region, and the channel stop region are formed.

Here, the nitride film and the SIPOS film are dry-etched, and the insulative film is wet-etched.

The SIPOS film and the nitride film are deposited by LP-CVD. Preferably, the nitride film is 500 to 5,000 Å thick.

It is preferable that the mask for exposing the insulative film has an aperture 2 to 5 $\mu$m smaller than an aperture of the nitride film.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
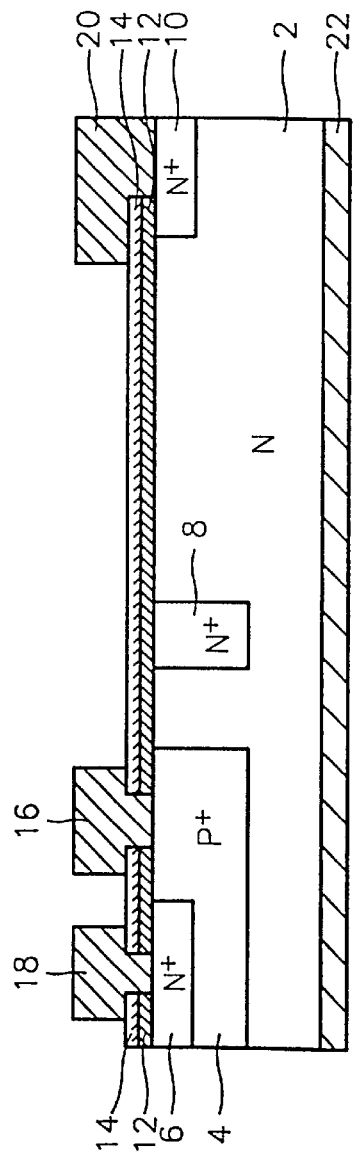
FIG. 1 is a cross-sectional view of a high breakdown voltage transistor using a conventional field limiting ring and a conventional semi-insulating polycrystalline silicon (SIPOS) film at the same time.

Hereinafter, the present invention will be described in detail with reference to the attached drawings. Embodiments of the present invention to be described later can be modified into various other forms, and the scope of the present invention is not interpreted as being restricted to the embodiments disclosed herein. The embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 3:
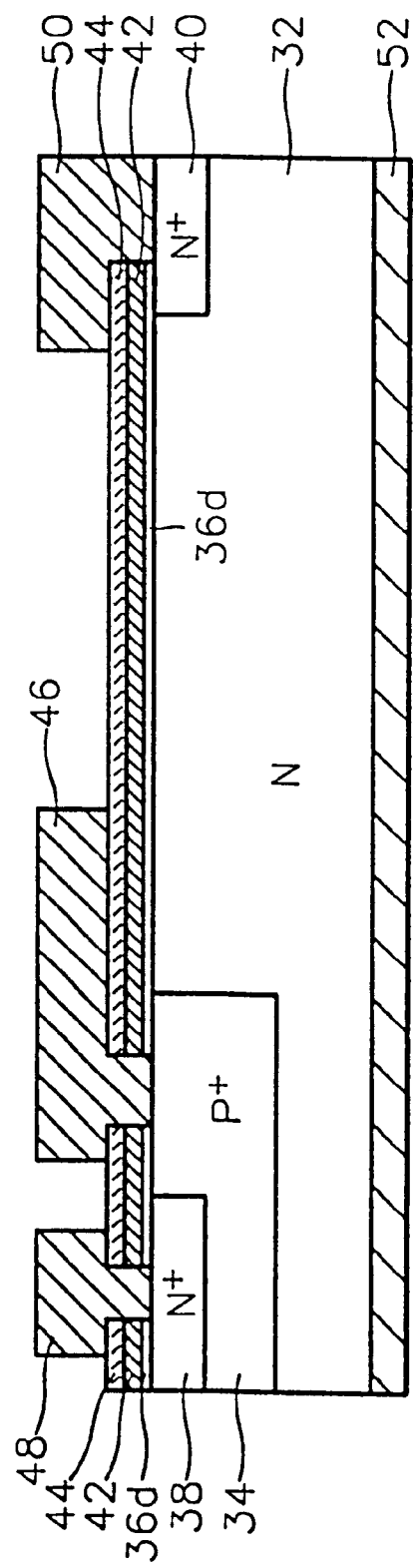
FIG. 3 is a cross-sectional view of a power semiconductor device using an SIPOS film according to a first embodiment of the present invention.

FIG. 3 is a cross-sectional view of an embodiment of a power semiconductor device which is a high breakdown voltage transistor.

Referring to FIG. 3, the power semiconductor device is comprised of a collector region 32 of a first conductivity type (N-type) formed on a semiconductor substrate, a base region 34 of a second conductivity type (P-type) formed in the collector region, an emitter region 38 of the first conductivity type (N-type) formed in the base region, and a channel stop region 40 as an isolator spaced a predetermined distance apart from the base region 34.

An insulating film 36d, a semi-insulating polycrystalline silicon (SIPOS) film 42, and a nitride film 44, which are patterned to expose the emitter region 38, the base region 34, and the channel stop region 40, respectively, are sequentially deposited on the semiconductor substrate. A base electrode 46, an emitter electrode 48 and an equipotential electrode 50 are connected to the base region 34, the emitter region 38, and the channel stop region 40, respectively.

Among the insulating film patterns 36d, the insulating film on the emitter region 38 has a thickness of 500 to 5,000 Å, the insulating film on the base region 34 has a thickness of 1,000 to 10,000 Å, and the insulating film formed on a field region between the base region 34 and the channel stop region 40 has a thickness of 3,500 to 20,000 Å.

Figure 2:
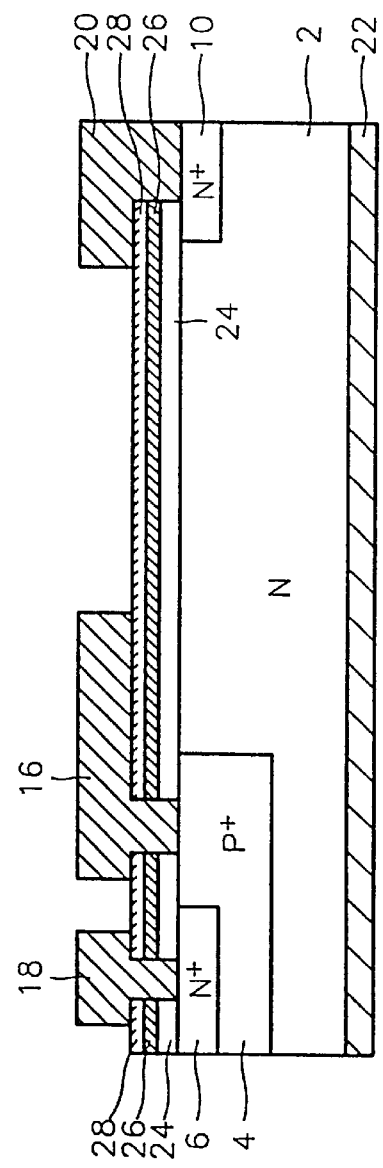
FIG. 2 is a cross-sectional view of another high breakdown voltage using a conventional SIPOS film.

The SIPOS film 42 and the nitride film 44 are deposited by low pressure chemical vapor deposition (LP-CVD), and the nitride film 44 has a thickness of about 500 to 5,000 Å and is significantly thinner compared to a thickness of 5,000 to 10,000 Å in the prior art. Therefore, a higher surface protection effect is provided than in the conventional structure using the double SIPOS film of FIG. 2. Also, the effect of a metal field plate can be prevented from being reduced, and a sufficient resistive field plate effect can be provided by the SIPOS film 42.

The base electrode 46 is extended by a predetermined distance in the direction of the field region and serves as a field plate for preventing an electric field from being concentrated on the edge of a junction between the base and collector regions.

FIGS. 4 through 7 are cross-sectional views illustrating a method of fabricating a power semiconductor device, which is a high breakdown voltage transistor.

Figure 4:
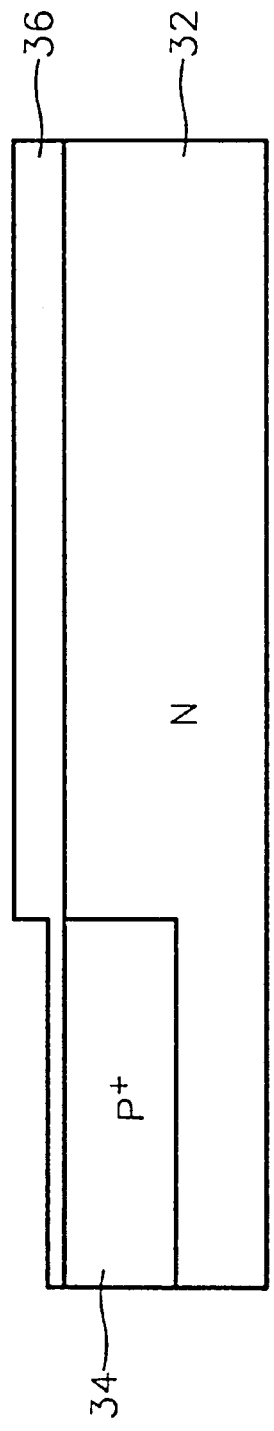
FIGS. 4 through 7 are cross-sectional views illustrating a method of fabricating a power semiconductor device, according to a first embodiment of the present invention.

Referring to FIG. 4, an oxide film is formed, for example, by thermal oxidation, on a semiconductor substrate on which a collector region 32 doped with first conductivity type (N-type) impurities is formed. The oxide film is patterned by a typical photolithography process, thereby exposing a region of the semiconductor substrate in which a base region will be formed.

A high concentration collector region (not shown) doped with impurities at higher concentration than the collector region 32 (low concentration collector region) may be formed below the collector region. The high concentration collector region (not shown) and the low concentration collector region 32, as well-known, can be formed by diffusion or by an epitaxial method. In the case of using the diffusion method, N-type impurities are deposited at high concentration on the other surface of the semiconductor substrate doped with N-type impurities, such as phosphorus (P) at low concentration, and the resultant structure is thermally treated, thereby forming the high concentration collector region (not shown) and the low concentration collector region 32.

In the case of using the epitaxial method, a low concentration epitaxial layer is grown on the semiconductor substrate doped with N-type impurities at high concentration, thereby forming the high concentration collector region (not shown) and the low concentration collector region 32.

Then, P-type impurities such as boron (B) are implanted at high concentration on an exposed semiconductor substrate, using the oxide film as a mask. The implanted ions are diffused by thermally treating the resultant structure at a temperature of about 1200 to 1300° C., thereby forming the base region 34. A thermal oxide film is grown on the semiconductor substrate by thermal treatment, thereby thickening the oxide film 36.

Figure 5:
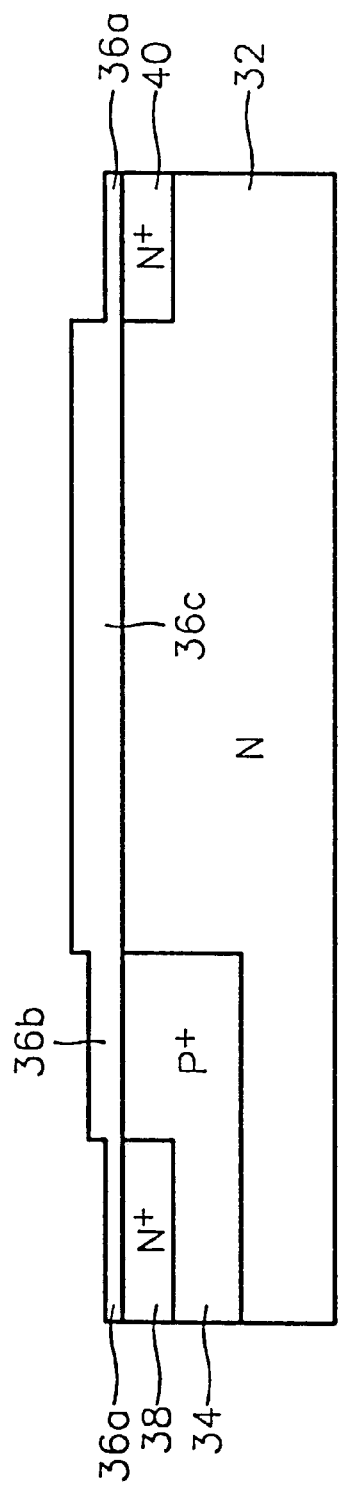

Referring to FIG. 5, the oxide film is patterned by photolithography, to expose a region of the semiconductor substrate in which the emitter region and the channel stop region will be formed. N-type impurities such as phosphorus (P) are implanted at high concentration in the semiconductor substrate using the oxide film as a mask, and the resultant structure is thermally treated at a temperature of about 1000 to 1200° C., thereby forming the emitter region 38 and the channel stop region 40.

At this time, the thermal oxide film is again grown on the semiconductor substrate by the thermal treatment. Thus, as shown in FIG. 5, oxide films having different thicknesses are formed on the field region, the base region and the emitter region, respectively. A great amount of impurities implanted to form the base region 34 and the emitter region 38 exists in the oxide film. Generally, an oxide film 36a on the emitter region has a thickness of 5,000 to 10,000 Å, an oxide film 36b on the base region has a thickness of 10,000 to 20,000 Å, and an oxide film 36c on the field oxide has a thickness of 15,000 to 30,000 Å. Because of the thickness of the oxide film, It takes a long time to form a contact in a subsequent dry-etching process. Thus, the productivity of this operation is degraded.

Meanwhile, when impurities are implanted to form the base region and the emitter region, some of them are also implanted into the oxide film. These impurities largely exist below the oxide film. These impurities cause instability of the breakdown voltage waveform of the high breakdown voltage device. Thus, in the present invention, a process of FIG. 6 is performed to solve the above problems.

Figure 6:
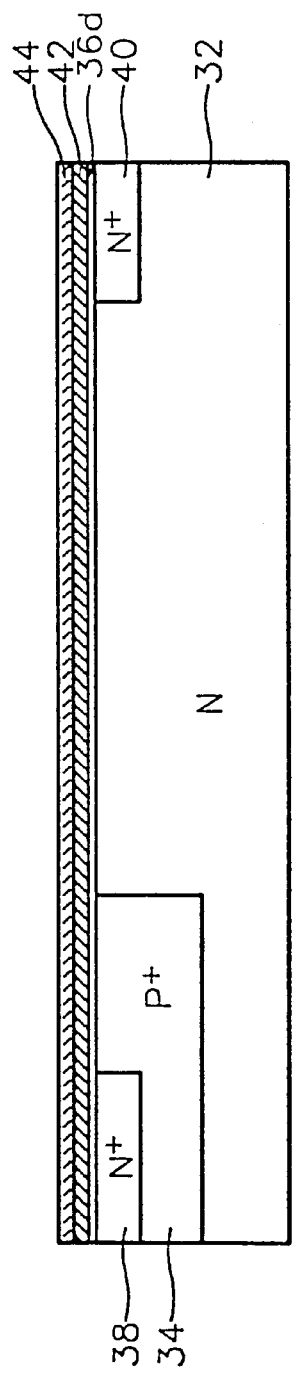

Referring to FIG. 6, the entire surface of the oxide film is wet etched for a predetermined time, thereby forming an oxide film of 500 to 5,000 Å thickness on the emitter region, an oxide film of 1,000 to 10,000 Å thickness on the base region, and an oxide film of 3,500 to 20,000 Å thickness on the field region. Accordingly, when the base region and the emitter region are formed, impurities implanted into the oxide film can be completely removed. As a result, the stability of the breakdown voltage can be greatly improved. Also, it takes a shorter time to dry-etch the oxide film in the subsequent process, thus greatly improving the productivity.

Next, an SIPOS film 42 and a nitride film 44 are sequentially deposited on the entire surface of the wet-etched oxide film 36d, using low pressure chemical vapor deposition (LPCVD). Here, the SIPOS film 42 is deposited to a thickness of about 5,000 Å, and the nitride film 44 is deposited to a thickness of 500 to 5,000 Å. Typically, a phospho-silicate glass (PSG) film, a nitride film, or an oxide film having a thickness of 5,000 to 10,000 Å is formed as a protection film on the SIPOS film. However, in the present invention, the nitride film is deposited to a thickness of about 500 to 5,000 Å using the LPCVD method by which a film material is densely deposited. When the nitride film 44 serving as a passivation film is thinly formed, the effect of a metal field plate formed on the nitride film 44 can be prevented from being reduced, and a sufficient field plate effect can be provided by the SIPOS film 42.

Figure 7:
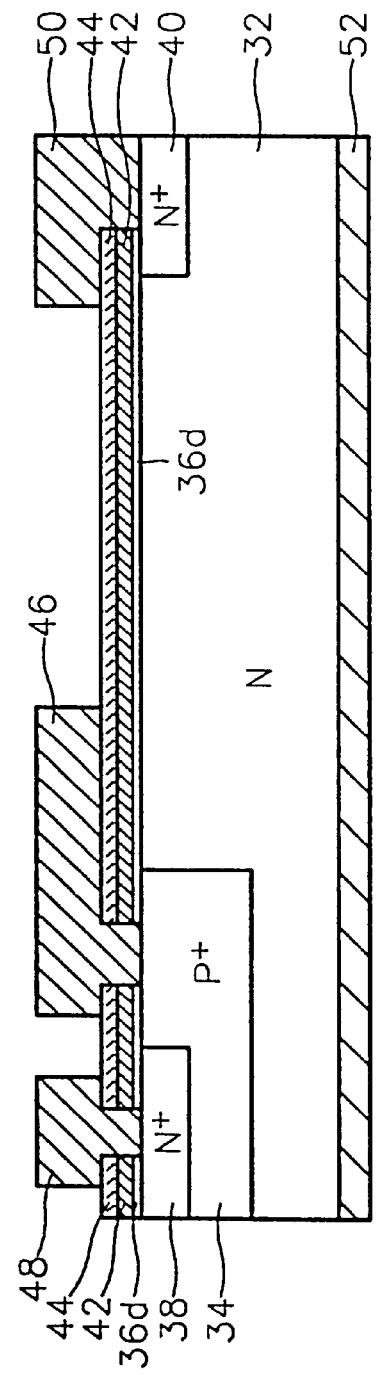

Referring to FIG. 7, the nitride film 44, the SIPOS film 42, and the oxide film 36d are sequentially dry-etched by a typical photolithography process, thus forming a contact hole which exposes the base region 34, the emitter region 38, and the channel stop region 40. Then, a metal film, e.g., an aluminum (Al) film, is deposited on the entire surface of the resultant structure on which the contact hole is formed, and the metal film is patterned, thus forming a base electrode 46, an emitter electrode 48, and an equipotential electrode 50 connected respectively to the regions.

The base electrode 46 extends to a field region as shown in FIG. 7, to reduce an electric field to be concentrated on the edge of a junction between the base region and the collector region.

Then, a collector electrode 52 is formed by depositing a metal film such as gold (Au) on the bottom surface of the collector region 32, thereby completing the formation of the high breakdown voltage transistor.

Figure 8:
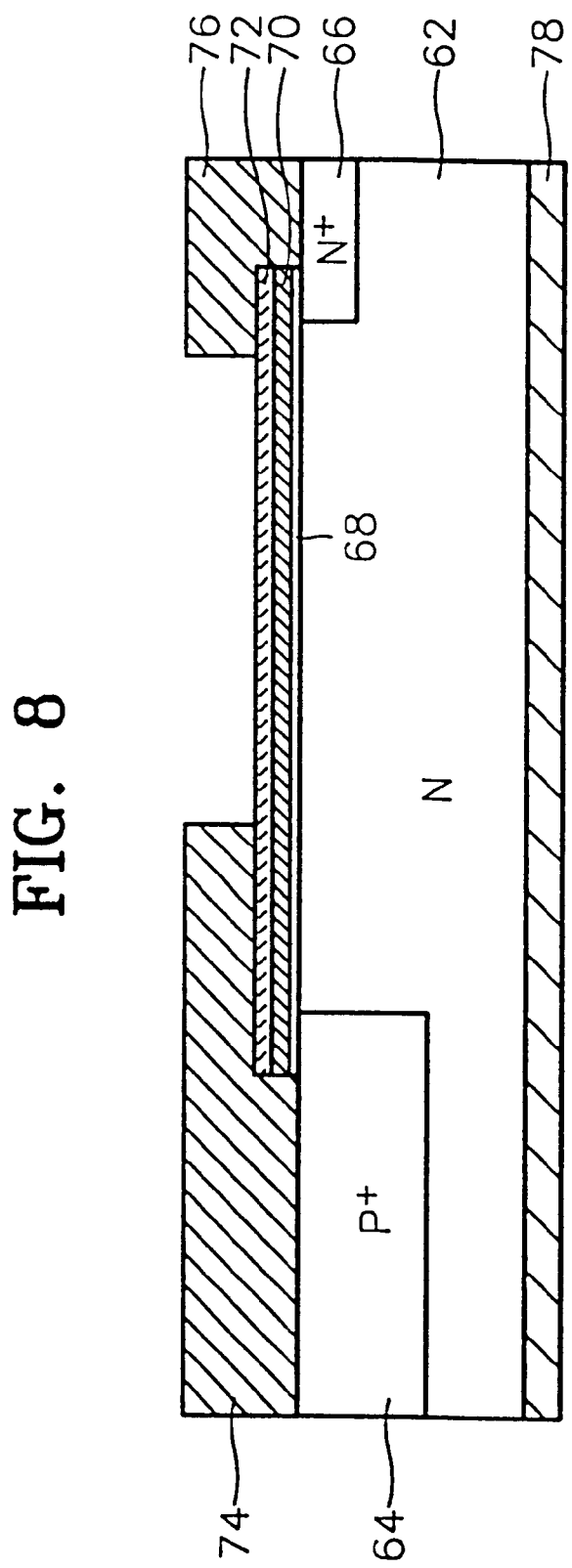
FIG. 8 is cross-sectional view of a power semiconductor device using an SIPOS film according to a second embodiment of the present invention.

FIG. 8 is a cross-sectional view of another embodiment a power semiconductor device which is a high breakdown voltage diode.

Reference numeral 62 is a cathode region, reference numeral 64 is an anode region, reference numeral 66 is a channel stop region, reference numeral 68 is an insulative film, reference numeral 70 is an SIPOS film provided to prevent an electric field from being concentrated on the edge of the anode region, reference numeral 72 is a passivation film, reference numeral 74 is an anode electrode connected to the anode region, reference numeral 76 is an equipotential electrode connected to the channel stop region, and reference numeral 78 is a cathode electrode.

Similar to the case of the high breakdown voltage transistor shown in FIG. 3, concentration of an electric field on the edge of the anode region 64 can be prevented by the SIPOS film 70. The passivation film 72 is a nitride film deposited by LPCVD to a thickness of about 500 to 5,000 Å as in the first embodiment. Thus, a sufficient resistive field plate effect can be provided by the SIPOS film 70 without reducing the effect of a metal field plate formed on the passivation film 72.

The insulative film 68 is a thermal oxide film whose thickness is different according to region. That is, it is preferable that the oxide film on the channel stop region is 500 to 5,000 thick, the oxide film on the anode region is 1,000 to 10,000 Å, and the oxide film on the field region is about 3,500 to 20,000 Å thick. Similar to the first embodiment, after the channel stop region 66 is formed, the entire surface of the oxide film 68 is wet etched before the SIPOS film 70 is deposited In the power semiconductor device and the fabrication method thereof according to the first and second embodiments of the present invention, a thin nitride film of about 500 to 5,000 Å is formed on the SIPOS film, to obtain a surface protection effect of protecting the device from external contamination or the like. Also, a sufficient resistive field plate effect can be obtained by the SIPOS film without reducing the effect of the metal field plate. Furthermore, the oxide film is blanket-etched before the SIPOS film is deposited, and thus the thickness of the oxide film is reduced, to substantially shorten the time required in a process for dry-etching the SIPOS film and the oxide film to form a contact. Therefore, the productivity can be improved.

Figure 9:
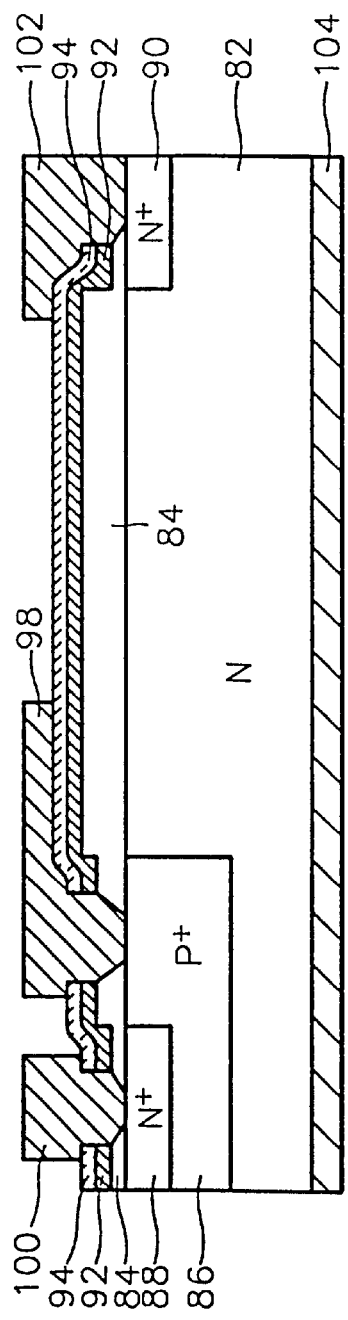
FIG. 9 is cross-sectional view of a power semiconductor device using an SIPOS film according to a third embodiment of the present invention.

FIG. 9 is a cross-sectional view of a power semiconductor device according to another embodiment. The same elements as those in the first embodiment shown in FIG. 3 will not be described again.

Referring to FIG. 9, a contact hole (not shown) exposing the base region, the emitter region and the channel stop region has a sidewall which is inclined as opposed to the structure of FIG. 3. That is, it can be seen that a nitride film 94 and an SIPOS film 92 are anisotropically etched, and an insulative film 84 is isotropically etched.

FIGS. 10 through 13 are cross-sectional views illustrating a method of fabricating a power semiconductor device, such as that shown in FIG. 8.

Figure 10:
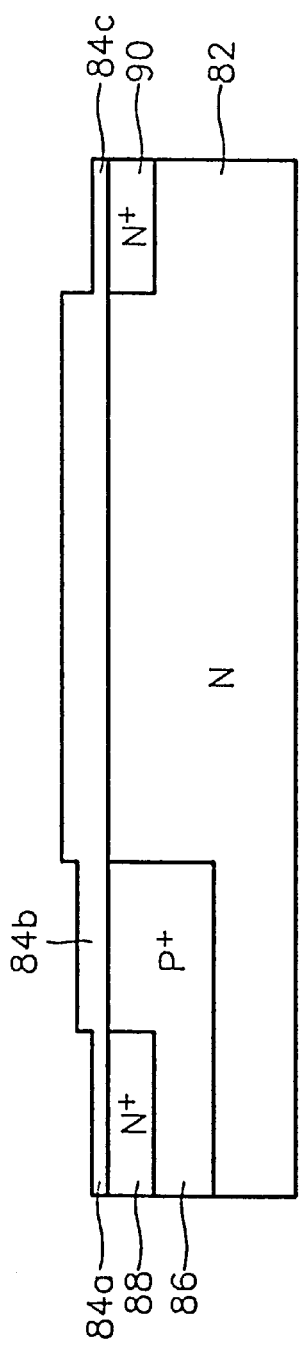
FIGS. 10 through 13 are cross-sectional views illustrating a method of fabricating a power semiconductor device, according to a third embodiment of the present invention.

Referring to FIG. 10, an oxide film 84 is formed on a semiconductor substrate on which a collector region 82 is formed by the method of the first embodiment of the present invention shown in FIGS. 4 and 5. Ion implantation and thermal diffusion are performed using the oxide film as a mask, thereby forming a base region 86, an emitter region 88 and a channel stop region 90 in the semiconductor substrate.

Here, in the oxide film formed on the semiconductor substrate, generally, an oxide film 84a on the emitter region has a thickness of 5,000 to 10,000 Å, an oxide film 84b on the base region has a thickness of 10,000 to 20,000 Å, and an oxide film 84c on a field region has a thickness of 15,000 to 30,000 Å.

Figure 11:
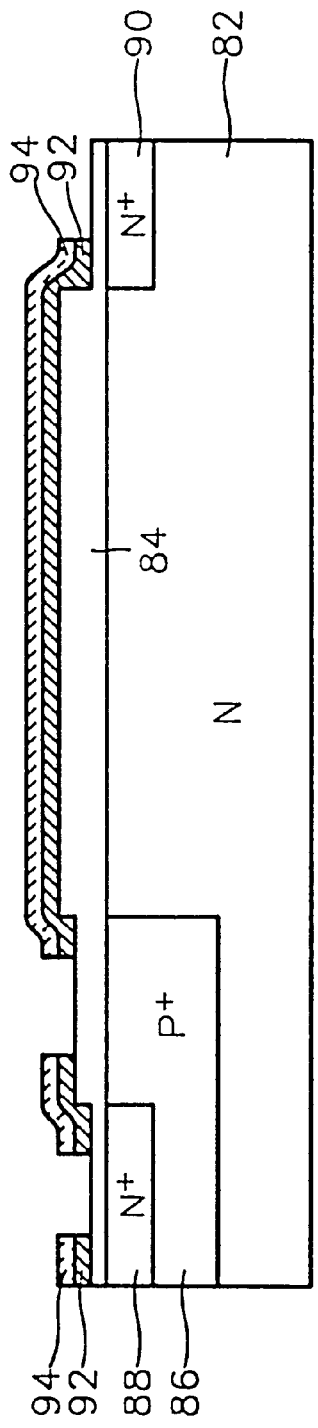

Referring to FIG. 11, an SIPOS film 92 and a nitride film 94 are sequentially deposited on the entire surface of the oxide film using LPCVD. Here, the SIPOS film 92 is deposited to a thickness of about 5,000 Å, and the nitride film 94 is deposited to a thickness of about 500 to 5,000 Å.

Next, the nitride film 94 and the SIPOS film 92 are sequentially anisotropically etched by photolithography, thereby exposing the oxide film 84 on the base region 86, the emitter region 88 and the channel stop region 90.

Figure 12:
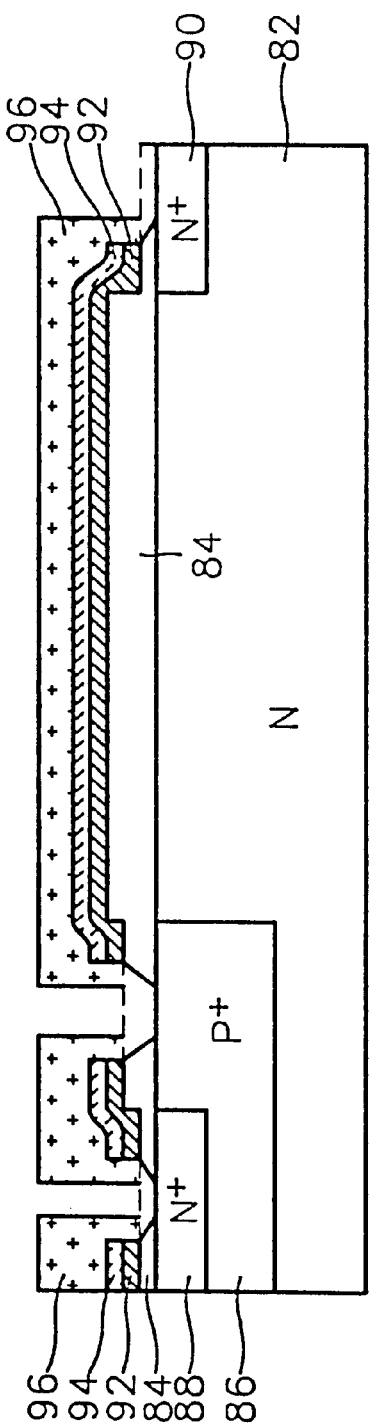

Referring to FIG. 12, a photoresist layer is coated on the entire surface of the resultant structure on which the oxide film 84 is partially exposed, and the photoresist film is exposed to light and developed, to form a photoresist pattern 96 for patterning the oxide film 84. Here, the photoresist pattern 96 is opened about 2 to 5 μm inward from the patterned nitride film 94 and the patterned SIPOS film 92, as shown in FIG. 12, in consideration of the amount of oxide film to be isotropically etched in a subsequent process.

Next, the oxide film 84 is wet-etched using the photoresist pattern 96 as an etch mask, to form a contact hole exposing the base region 86, the emitter region 88, and the channel stop region 90. The dotted region of this drawing represents the oxide film before it is etched.

As described above, an oxide film 84b of FIG. 10 formed on the base region 86 is significantly thick (10,000 to 20,000 Å). Thus, if the oxide film is dry-etched without a special treatment of the oxide film, the process time increases, greatly reducing the productivity. Also, the oxide film 84a of FIG. 10 on the emitter region 88 is significantly thinner than the oxide film on the base region, such that the surface of the emitter region 88 may be damaged during dry-etching the oxide film. Furthermore, in a subsequent process, i.e., when a metal film is deposited to form an electrode, the step coverage of the metal film may be extremely degraded due to a severe step difference between each region or a high aspect ratio of a contact hole caused by a thick oxide film.

Therefore, after the nitride film 94 and the SIPOS film 92 are primarily dry-etched as in the present invention, a photoresist film is formed to be capable of being opened about 2 to 5 μm inward, and the oxide film is wet-etched using the photoresist film as a mask. By doing this, the above-described problem in the prior art can be effectively solved.

Figure 13:
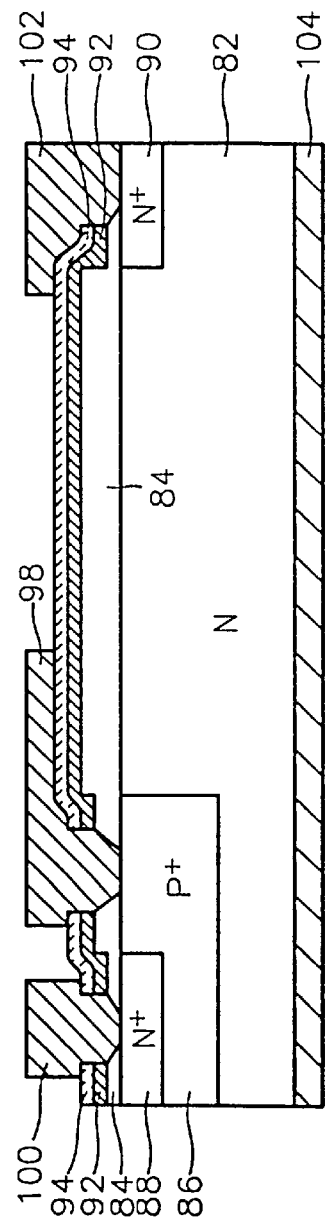

Referring to FIG. 13, the photoresist pattern is removed, and a metal film such as an aluminum (Al) film is then deposited. The metal film is patterned by a typical photolithography method, thereby forming a base electrode 98, an emitter electrode 100, and an equipotential electrode 102. A metal film is deposited on the bottom surface of the collector region 82, to form a collector electrode 104, thereby completing the formation of a high breakdown voltage transistor.

Figure 14:
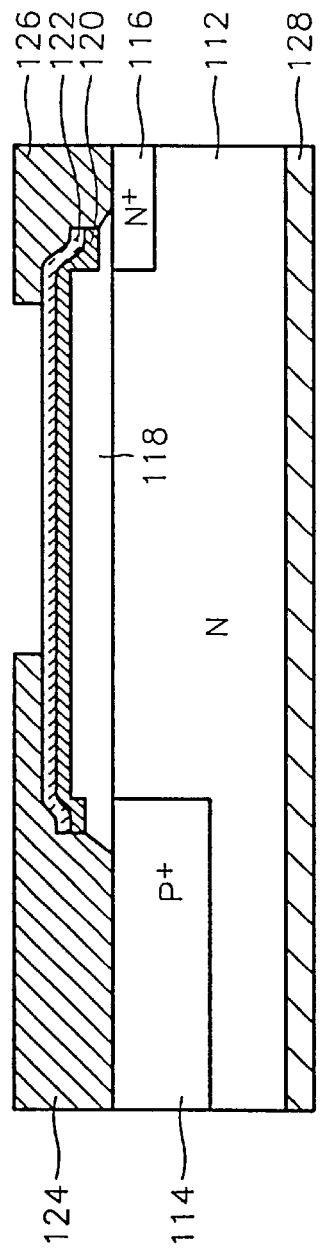
FIG. 14 is cross-sectional view of a power semiconductor device using an SIPOS film according to a fourth embodiment of the present invention.

FIG. 14 is a cross-sectional view of another embodiment of a power semiconductor device, which is a high breakdown voltage diode, produced by a method similar to that shown in FIGS. 10–13.

Reference numeral 112 is a cathode region, reference numeral 114 is an anode region, reference numeral 116 is a channel stop region, reference numeral 118 is an insulative film, reference numeral 120 is an SIPOS film provided to prevent an electric field from being concentrated on the edge of an anode-cathode junction, reference numeral 122 is a passivation film, reference numeral 124 is an anode electrode connected to the anode region, reference numeral 126 is an equipotential electrode connected to the channel stop region, and reference numeral 128 is a cathode electrode.

Similar to the case of the high breakdown voltage transistor shown in FIG. 9, concentration of an electric field on the edge of the anode region 114 can be prevented by the SIPOS film 120. The passivation film 122 is a nitride film deposited by LP-CVD, and its thickness is about 500 to 5,000 Å as in the third embodiment. Therefore, a sufficient resistive field plate effect can be obtained by the SIPOS film 120 without reducing the effect of a metal field plate to be formed on the passivation film 122.

As in the case of the third embodiment, after the passivation film 122 is deposited, the passivation film 122 and the SIPOS film 120 are first dry-etched, a photoresist film is formed to be capable of being opened about 2 to 5 m inward, and an oxide film 118 is wet-etched using the photoresist film as a mask. Then, productivity will not be degraded when the oxide film is dry-etched. Also, damage of the surface of the channel stop region 116 due to a difference in thickness between the oxide film on the channel stop region 116 and the oxide film on the anode region 114 can be prevented. Furthermore, degradation of the step coverage of the metal film due to a high aspect ratio in the subsequent process, i.e., when a metal film is deposited to form an electrode, can be solved.

According to the power semiconductor device and the fabrication method thereof as described above, a thin nitride film of about 500 to 5,000 Å is formed by LP-CVD as a passivation film on an SIPOS film. When such a thin nitride film is formed as a passivation film, a surface protection effect of protecting the device from external contamination can be obtained. Also, a sufficient resistive field plate effect can be gained by the SIPOS film without reducing the effect of a metal field plate.

When the thickness of the oxide film is decreased by blanket-etching by a predetermined thickness the oxide film used as a mask for forming the base region, the emitter region, and the channel stop region before the SIPOS film is deposited, impurities implanted into the oxide film when the base region and the emitter region are formed can be completely removed. Thus, the stability of a breakdown voltage can be greatly improved, and also the time required to dry-etch the oxide film in a subsequent process can be reduced, thus greatly improving the productivity.

Also, the nitride film and the SIPOS film are first dry-etched after the nitride film as a passivation film is deposited, a photoresist film is formed to be capable of being opened about 2 to 5 μ, inward, and the oxide film is wet-etched using the photoresist film as a mask. Then, productivity will not be degraded when the oxide film is dry-etched. Also, damage of the surface of the emitter region due to a difference in thickness between the oxide film on the base region and the oxide film on the emitter region can be prevented. Furthermore, degradation of the step coverage of the metal film due to a high aspect ratio in the subsequent process, i.e., when a metal film is deposited to form an electrode, can be solved by forming a contact hole to be inclined.

What is claimed is:

1. A method of fabricating a power semiconductor device, comprising:

(a) forming a collector region of a first conductivity type in a semiconductor substrate;

(b) forming a first insulative film for exposing a region of the semiconductor substrate in which a base region is to be formed, on the semiconductor substrate in which the collector region is formed;

(c) forming a base region of a second conductivity type formed in the collector region and simultaneously forming a second insulative film on an entire principal surface of the semiconductor substrate;

(d) exposing a region of the semiconductor substrate in which an emitter region and a channel stop are to be formed;

(e) forming an emitter region of the first conductivity type and a channel stop region by implanting impurities into the semiconductor substrate, and simultaneously forming a third insulative film on the entire principal surface of the semiconductor substrate;

(f) etching the insulative films by a predetermined thickness;

(g) forming an SIPOS film and a nitride film on the principal surface of the semiconductor substrate, and exposing parts of the base region, emitter region and channel stop region; and (h) forming a base electrode, an emitter electrode, and an equipotential electrode connected respectively to the base region, the emitter region, and the channel stop region.

2. The method of fabricating a power semiconductor device as claimed in claim 1, wherein the insulative films on the emitter region are 500 to 5,000 Å thick, the insulative films on the base region are 1,000 to 10,000 Å thick, and the insulative films on a field region between the base region and the channel stop region are about 3,500 to 20,000 Å thick.

3. The method of fabricating a power semiconductor device as claimed in claim 2, wherein the insulative films are wet-etched.

4. The method of fabricating a power semiconductor device as claimed in claim 1, wherein the SIPOS film and the nitride film are deposited by LP-CVD.

5. The method of fabricating a power semiconductor device as claimed in claim 4, wherein the nitride film is 500 to 5,000 Å thick.

6. The method of fabricating a power semiconductor device as claimed in claim 1, wherein the nitride film, the SIPOS film, and the insulative films are sequentially dry-etched.

7. A method of fabricating a power semiconductive device, comprising:

(a) forming a collector region of a first conductivity type in a semiconductor substrate;

(b) forming a first insulative film for exposing a region of the semiconductor substrate in which a base region is to be formed, on the semiconductor substrate in which the collector region is formed;

(c) forming a base region of a second conductivity type formed in the collector region and simultaneously forming a second insulative film on an entire principal surface of the semiconductor substrate;

(d) exposing a region of the semiconductor substrate in which an emitter region and a channel stop region are to be formed;

(e) forming an emitter region of the second conductivity type and a channel stop region by implanting impurities into the semiconductor substrate, and simultaneously forming a third insulative film on the entire principal surface of the semiconductor substrate;

(f) forming an SIPOS film and a nitride film on the entire principal surface of the semiconductor substrate, and etching the nitride film and the SIPOS film on the base region, the emitter region, and the channel stop region;

(g) forming a mask which exposes the insulative films on the base region, the emitter region and the channel stop region, on the resultant structure;

(h) patterning the insulative films using the mask; and (i) forming a base electrode, an emitter electrode, and an equipotential electrode connected respectively to the base region, the emitter region, and the channel stop region.

8. The method of fabricating a power semiconductor device as claimed in claim 7, wherein the nitride film and the SIPOS film are dry-etched, and the insulative films are wet-etched.

9. The method of fabricating a power semiconductor device as claimed in claim 7, wherein the SIPOS film and the nitride film are deposited by LP-CVD.

10. The method of fabricating a power semiconductor device as claimed in claim 9, wherein the nitride film is 500 to 5,000 Å thick.

11. The method of fabricating a power semiconductor device as claimed in claim 7, wherein the mask has an aperture 2 to 5 $\mu$m smaller than an aperture of the nitride film.

* * * * *